United States Patent [19]

Habuka

[11] Patent Number: 5,057,442
[45] Date of Patent: Oct. 15, 1991

[54] PROCESS FOR PREPARING LIGHT-EMITTING DIODES USING A MAXIMUM LAYER THICKNESS EQUATION

[75] Inventor: Hitoshi Habuka, Maebashi, Japan

[73] Assignee: Shin-Etsu Handotai Co., Ltd., Tokyo, Japan

[21] Appl. No.: 530,876

[22] Filed: May 30, 1990

[30] Foreign Application Priority Data

May 30, 1989 [JP] Japan ................... 1-138355

[51] Int. Cl.$^5$ .................... H01L 21/66; H01L 21/20
[52] U.S. Cl. ................... 437/8; 148/DIG. 95; 437/127; 437/128; 437/906
[58] Field of Search ............. 148/DIG. 56, 65, 72, 148/95, 162; 356/381, 382; 156/610–614; 357/16, 17; 427/248.1, 255.1; 372/43, 44, 45, 46; 437/8, 81, 105, 107, 126, 127, 128, 133, 129, 905, 906

[56] References Cited

U.S. PATENT DOCUMENTS

| | | | |
|---|---|---|---|
| 4,243,882 | 1/1981 | Yasujima et al. | 250/339 |
| 4,633,280 | 12/1986 | Takasu | 357/17 |
| 4,695,162 | 9/1987 | Itonaga et al. | 356/369 |
| 4,757,510 | 7/1988 | Kaneno et al. | 357/17 |
| 4,787,749 | 11/1988 | Ban et al. | 356/382 |
| 4,865,655 | 9/1989 | Fujita et al. | 148/33 |
| 4,893,313 | 1/1990 | Hatakoshi et al. | 372/46 |
| 4,984,894 | 1/1991 | Kondo | 356/382 |

FOREIGN PATENT DOCUMENTS

60-57214 12/1985 Japan.
1-58457 6/1989 Japan.

OTHER PUBLICATIONS

Holtslag et al., "Optical Measurement of the Refractive Index, Layer Thickness . . . ", Applied Optics, vol. 28, No. 23, Dec. 1, 1989, pp. 5095–5104.
Rammo et al., "The Dependence of Axial Wavelength Separation of GaAs–GaAlAs . . . ", Eesti NSV Teaduste Akadeemia, vol. 30, No. 1, 1981, pp. 22–28.
Ikeda et al., "Design Parameters of Frequency Response of GaAs–(Ga,Al)As Double Heterostructure . . . ", Proceedings of the SID, vol. 18, No. 2, 1977, pp. 217–221.
The Japanese Journal of Applied Physics article in vol. 25, No. 9.
Japan Patent Abstract JP-A-60 187013.
Japan Patent Abstract JP-A-60 214524.

Primary Examiner—Olik Chaudhuri
Assistant Examiner—William Bunch
Attorney, Agent, or Firm—Longacre & White

[57] ABSTRACT

A light-emitting diode prepared by a new process is disclosed. The light-emitting diode has compound semiconductor epitaxial layers composed of $GaAs_{1-x}P_x$ ($0 \leq x \leq 1$) on a compound semiconductor GaP single-crystal substrate, and has a light-emitting layer provided with a p-n junction formed in the surface layer region of the epitaxial layers. The diode is characterized in that it has a total maximum thickness of the epitaxial layers 20 to 40 μm.

The process for preparing the diode is characterized in that the process can determine a required maximum thickness of the compound semiconductor epitaxial layers by presuming light output power from the thickness of the epitaxial layers based on the following equation:

$$L = \exp(Ax_0 + B) + C$$

where A, B and C are definite values obtained from experiments conducted, L is light output power and $x_0$ is the total thickness of the epitaxial layers.

1 Claim, 3 Drawing Sheets

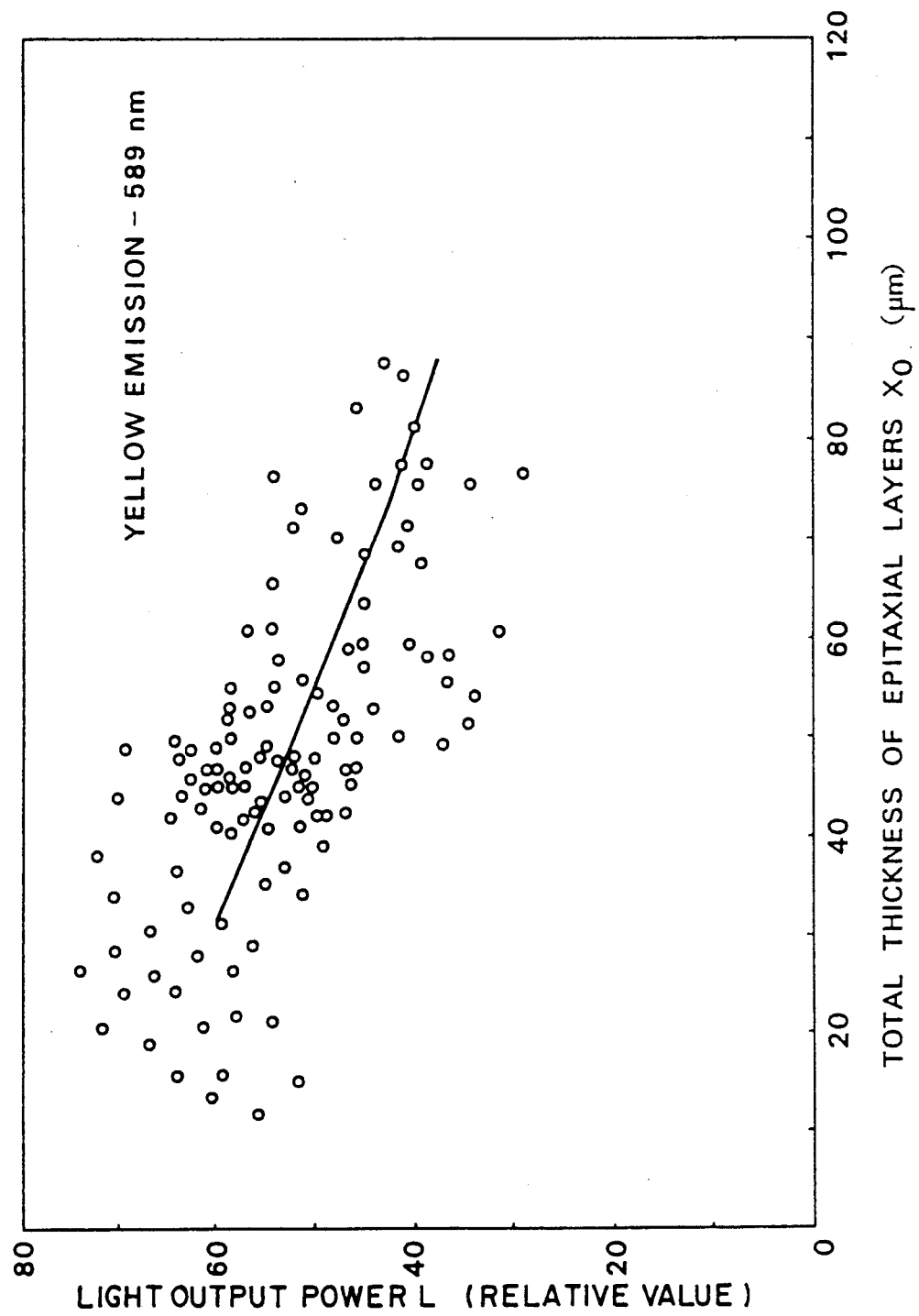

PROCESS FOR PREPARING LIGHT-EMITTING DIODES USING A MAXIMUM LAYER THICKNESS EQUATION

DETAILED DESCRIPTION OF THE INVENTION

1. Industrial Field of the Invention

The present invention relates to a light-emitting diode constituted by a compound semiconductor single crystal GaAs$_{1-x}$P$_x$ ($0 \leq x \leq 1$) and to a process for preparing a starting wafer for the light-emitting diode.

2. Statement of the Prior Art

It is known that a compound semiconductor structure having a p-n junction formed therein emits light when forward biased. This characteristic is used for preparation of light-emitting diodes from compound semiconductors. Such a technology is disclosed, for instance, in Japanese Patent Examined Publication No. 60-57214. To sum it up, a diode prepared by this technology has a structure in which, for example, a graded alloy composition epitaxial layer of GaAs$_{1-x}$P$_x$ ($0 \leq x \leq 1$) is formed on a GaP single-crystal substrate and further thereon a constant alloy composition epitaxial layer of GaAs$_{1-x}$P$_x$ (x=constant) is formed. It is to be noted that the constant composition epitaxial layer stated above includes a light-emitting nitrogen-doped layer which further contains p-type layer diffused, for instance, with Zn.

It is the present status of the prior art that in designing the total thickness of epitaxial layers of a epitaxial wafer to be used for the light-emitting diodes, attention is paid only to the thickness of the constant composition epitaxial layers, while the thickness of the graded alloy composition epitaxial layer is arbitrarily selected except for the condition that a thickness of the graded alloy composition epitaxial layer is pretty larger than to prevent the crystallinity of the constant composition epitaxial layer from the least deterioration.

SUMMARY OF THE INVENTION

Various experiments conducted by the present inventor for the purpose of improving the light output power of light-emitting diodes show how largely the light output power depends on the total thickness of the epitaxial layers on the substrate.

The present invention was made according to this novel discovery.

It is an object of the present invention to provide both a high output power light-emitting diode prepared from a compound semiconductor GaAs$_{1-x}$P$_x$ ($0 \leq x \leq 1$) single-crystal wafer and a preparing technique for the light-emitting diode both of which cannot be provided by the prior art. The other purposes and novel features according to the present invention will be clear from the description and accompanying figures to this specification.

It is the first point of the present invention that a light-emitting diode having alloyed compound semiconductor epitaxial layers constituted by GaAs$_{1-x}$P$_x$ ($0 \leq x \leq 1$) on a compound semiconductor single-crystal substrate and having a light-emitting layer provided with a p-n junction formed in a surface layer region of said epitaxial layers has said epitaxial layers being set at 20 to 40 μm in total thickness.

The second point of the present invention is that a process for preparing a compound semiconductor wafer for a light-emitting diode having a light-emitting layer provided with a p-n junction formed in a surface constant alloy composition region of compound semiconductor epitaxial layers constituted by GaAs$_{1-x}$P$_x$ ($0 \leq x \leq 1$) on a compound semiconductor single-crystal substrate, is for determining a maximum required thickness of said compound semiconductor epitaxial layers by estimating light output power from said thickness of said epitaxial layers based on the following equation:

$$L = exp(Ax_0 + B) + C$$

where A, B and C are definite values obtained from experiments, where light output power is L and the total thickness of the epitaxial layers is $x_0$.

According to the present invention the total thickness of the epitaxial layers stated above is determined to be 20 μm to 40 μm. This reduces the amount of optical absorption within the bulk of the epitaxial layers compared to conventional epitaxial layer thicknesses of about 50 to 100 μm and at the same time reduces the time and costs for preparing an epitaxial wafer.

Further, as the conditions of preparing light-emitting diodes can vary the thicknesses of the p-type and n-type constant composition epitaxial layers on the both sides of the p-n junction or the thickness of the graded alloy composition layer, several experiments are carried out on a relation between the total thickness $x_0$ of the epitaxial layers and the light output power L to find the range practically satisfying the equation $L = exp(Ax_0 + B) + C$, so that the minimum total thickness $x_0$ is able to be precisely determined so as to have the highest output power obtainable for the specifications required for a specified light-emitting diode.

Thus, it is possible that high power light emitting diodes (LEDs), which cannot be realized by the conventional techniques, are obtained.

BRIEF DESCRIPTION OF THE DRAWINGS

FIG. 4 shows a relationship between the total thickness of the epitaxial layers of a light-emitting diode for yellow emission and the light output power (in relative values).

DESCRIPTION OF THE PREFERRED EMBODIMENTS

Figure 1:
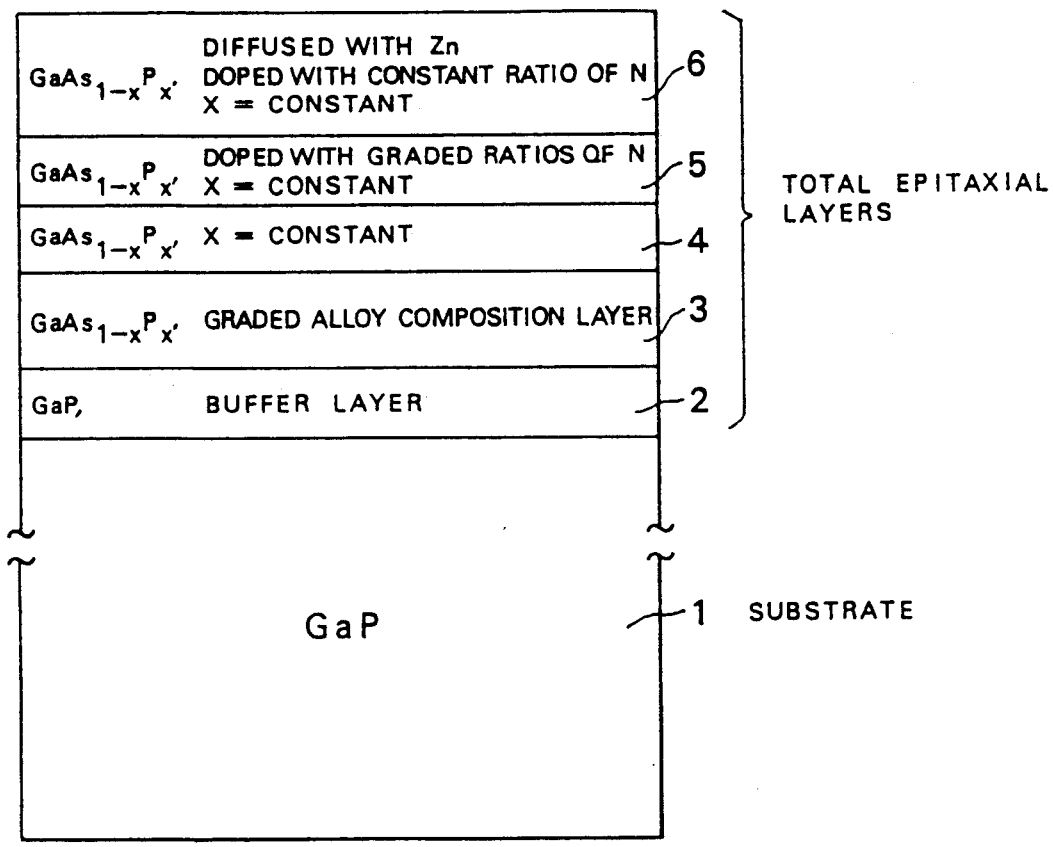
FIG. 1 shows a light-emitting diode schematically.

The preferred embodiments of the light-emitting diode according to the present invention will be described in reference to the accompanying drawings.

The light-emitting diode of the preferred embodiments has a GaP layer (buffer layer) 2 which is an epitaxial layer formed directly on a GaP substrate 1. The GaP layer (buffer layer) 2 is grown epitaxially directly on the GaP substrate 1, because a graded alloy composition layer 3 (described later) deposited directly on the GaP substrate 1 will often cause the crystallinity in the graded alloy composition layer 3 to be in disorder due to the lattice mismatch between the substrate 1 and the layer 3. Consequently, a graded alloy composition layer 3 constituted by an epitaxial layer is formed on GaP layer 2. This graded alloy composition epitaxial layer 3 is represented by a general expression, $GaAs_{1-x}P_x$. The value x in this expression depends upon the emission light wavelengths of the light-emitting diode. For yellow emission, for instance, the value x is controlled to vary gradually from 1 to 0.85. Further, a first constant composition epitaxial layer 4, which constitutes a $GaAs_{1-x}P_x$ (x=constant) epitaxial layer, is formed on the graded alloy composition epitaxial layer 3 stated above. Still further, on the constant composition epitaxial layer 4 there is formed the second same constant composition $GaAs_{1-x}P_x$ (x=constant) epitaxial layer 5. This layer 5 is grown by gradually increasing the amount of $NH_3$ in the reactant gas stream so that the doped amount of N can be gradually increased in the crystal layer 5. Then, on the epitaxial layer 5 is formed the third same constant composition $GaAs_{1-x}P_x$ (x=constant) epitaxial layer 6, which is doped with a constant ratio of nitrogen. It is to be noted that the constant composition epitaxial layers 4, 5, 6 have a value x, for instance, of 0.85 for yellow emission.

The third constant composition epitaxial layer 6 of n-type is diffused with Zn from the surface thereof to form a p-type impurity diffused layer within the surface region of the layer 6, thereby the third constant composition epitaxial layer 6 can be constituted to perform a function as a light-emitting layer with the p-n junction in it.

Incidentally, in the preferred embodiments according to the present invention, the constant composition epitaxial layer 6 is constituted to have a thickness 10 $\mu$m and more so that the function of the layer 6 as a light-emitting layer is not impaired. Further, in the preferred embodiments according to the present invention, the total thickness $x_0$ of the epitaxial layers 2, 3, 4, 5, 6 is adjusted to be 40 $\mu$m or less. This total thickness $x_0$ of the epitaxial layers should preferably be minimal so that the thickness is as large as does not deteriorate the light-emitting power of a light-emitting diode.

The reason the thickness of the constant composition epitaxial layer 6 is set at 10 $\mu$m and more is that the thicknesses less than 10 $\mu$m prevent the good p-n junction from being formed within the layer 6, with an adverse possibility that the function of light emission which the layer 6 has may be impaired. The reason the total thickness $x_0$ of the epitaxial layers is set at 40 $\mu$m and less is that such a thickness allows the amount of optical absorption within the epitaxial layers to be made small, with the result that a sufficient light output power can be obtained.

Next, an overall process for preparing such a diode will be explained. Then, experimental results on how the light output power varies with the total thickness of the epitaxial layers in case the thickness of the constant composition epitaxial layer 6 is set at 15 $\mu$m will be described. Based on some theoretical considerations an explanation will also be made on that the adjustment of the thickness of the total epitaxial layers within the range of 20 to 40 $\mu$m allows the maximum light output power to be obtained.

For example, a GaP layer (buffer layer) 2 is formed on a GaP substrate 1 by means of an epitaxial growth process. Then, a graded alloy composition $GaAs_{1-x}P_x$ epitaxial layer 3 is formed by the epitaxial growth process. Subsequently, a constant composition epitaxial layer 4 is formed by the epitaxial growth process. Further, a constant composition $GaAs_{1-x}P_x$ epitaxial layer 5 is grown on the layer 4 by the epitaxial growth method with the amount of nitrogen added being increased gradiently. Where the ratio of nitrogen added reaches a predetermined value, a constant composition $GaAs_{1-x}P_x$ epitaxial layer 6 is formed on the layer 5 by the epitaxial growth method with the amount of nitrogen added being kept constant. As a final process, the constant composition epitaxial layer 6 of n-type is diffused with Zn, a p-type impurity, from the surface thereof to form a p-type layer within the layer 6. Further, electrodes are formed.

At this time, the total thickness of the epitaxial layers is set at 40 $\mu$m or less; the thickness of the constant composition epitaxial layer 6 is set at 15 $\mu$m.

On the other hand, the epitaxial layers which have been grown thick enough can be controlled in thickness by means of chemical etching the layer 6 so that the thickness of the epitaxial layers and the constant composition layer 6 can be adjusted.

Light-emitting diodes thus obtained permit the optical absorption within the epitaxial layers to be reduced, with the consequence that diodes with high light output power can be produced.

Figure 2:
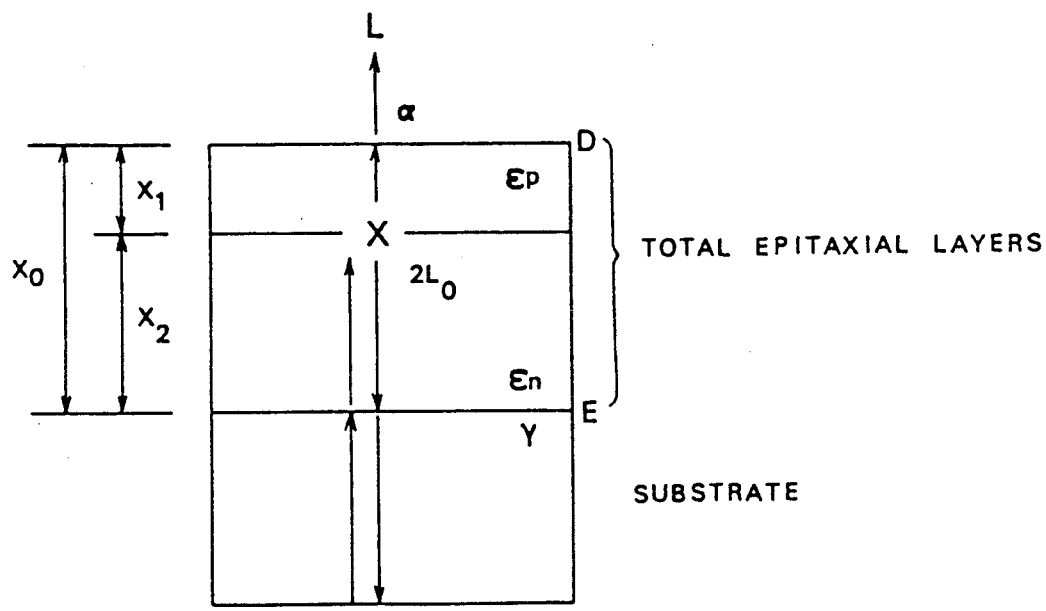
FIG. 2 is a schematic drawing explaining a principle of the present invention.

A principle, which has been used for the above process, will be explained in a form of a numerical expression. At this time, to expedite formulation we assume as follows:

As shown in FIG. 2, (1) Light generated only at a point (X) in the p-n junction plane is considered.

(2) Light output power $2L_0$ in the p-n junction plane is assumed to distribute uniformly.

(3) There are two beams of light considered to generate from Point X, i.e., one beam $L_0$ directing towards the surface of the epitaxial layers, and the other beam $L_0$ directing towards the inside of the epitaxial layers.

(4) The optical absorption coefficient is $\epsilon p$ in the p-type region and $\epsilon n$ in the n-type region.

(5) The light beam directed to the inside of the epitaxial layers is reflected at the bottom plane of the crystal substrate to return to Point X. At this time, the light output power is reduced at a constant ratio ($\gamma$) within the substrate. The reflected beam of light passes through Point X and joins the beam which directs from Point X towards Plane D, which is the surface of the last epitaxial layer. (Plane E is an interface between the graded composition epitaxial growth layer and the GaP buffer layer.)

(6) The optical absorption within the epitaxial layers obeys the Law of Lambert.

(7) The beam of light which arrives at the surface of the epitaxial layers is cut off and absorbed at an absorption coefficient of $\alpha$ in a given amount thereof at the surface. The equations for the optical absorption on each beam path and for intensity of light emitted are as follows:

$$\ln\{L - \alpha L_0 \exp(-\epsilon p x_1) = \ln\{\alpha\gamma L_0 \exp(-\epsilon p x_1) + 2\epsilon n x_1 - 2\epsilon n x_0$$

where $x_1$ is the thickness of the p-type region. Symbol $x_2$ is the thickness of the n-type region. Symbol $x_0$ is the total thickness of the epitaxial layers, that is, $x_0 = x_1 + x_2$. If we let $-2\epsilon n = A$, $\ln\{\alpha\gamma L_0 \exp(-\epsilon p x_1) + 2\epsilon n x_1 = B$, and $\alpha L_0 \exp(-\epsilon p x_1) = C$, then the above equation becomes $$\ln(L-C) = Ax_0 + B \ldots \quad (a)$$

$$L = \exp(Ax_0 + B) + C \ldots \quad (b).$$

We have obtained approximate expressions (a) and (b). In order to make sure that these approximate expressions hold in practical cases, actual data are used to carry out least square approximation with respect to the above equation (a).

TABLE 1 approximation for (a) $\ln(L - C) = Ax_0 + B$

| C | B | A | Sum of error squared | $n = (A/-2)/ \mu m^{-1}$ |
|---|---|---|---|---|
| Orange | | | | |
| 5 | | | 4340.27 | |
| 0 | 4.504 | $-1.299 \times 10^{-2}$ | 4329.34 | $6.495 \times 10^{-3}$ |
| −6 | 4.544 | $-1.133 \times 10^{-2}$ | 4325.77 | $5.665 \times 10^{-3}$ |
| −7 | 4.551 | $-1.110 \times 10^{-2}$ | 4325.75 | $5.550 \times 10^{-3}$ |
| −8 | 4.559 | $-1.087 \times 10^{-2}$ | 4325.84 | $5.435 \times 10^{-3}$ |
| Yellow | | | | |
| 0 | 4.362 | $-8.268 \times 10^{-3}$ | 5478.98 | $4.134 \times 10^{-3}$ |
| −5 | 4.416 | $-7.477 \times 10^{-3}$ | 5475.59 | $3.739 \times 10^{-3}$ |
| −41 | 4.757 | $-4.448 \times 10^{-3}$ | 5469.75 | $2.224 \times 10^{-3}$ |
| −42 | 4.766 | $-4.399 \times 10^{-3}$ | 5469.7439 | $2.200 \times 10^{-3}$ |
| −43 | 4.774 | $-4.351 \times 10^{-3}$ | 5469.7444 | $2.176 \times 10^{-3}$ |

In the table 1, the set of A, B and C which correspond to each close to the least sum of error squared has been ascertained to successfully fill the purpose of approximation. It is known that values $C=0$, $B=4.5$, $A=-1.3\times 10^{-2}$ for orange emission and values $C=0$, $B=4.4$, $A=-8.3\times 10^{-3}$ for yellow emission can be selected as the best match for the data from the following experiment. The absorption coefficients (for the whole range of the emission wavelengths) empirically obtained here are 60 cm$^{-1}$ for orange emission and 30 cm$^{-1}$ for yellow emission. These values are quite compatible with the published values of GaP and GaAs.

Figure 3:
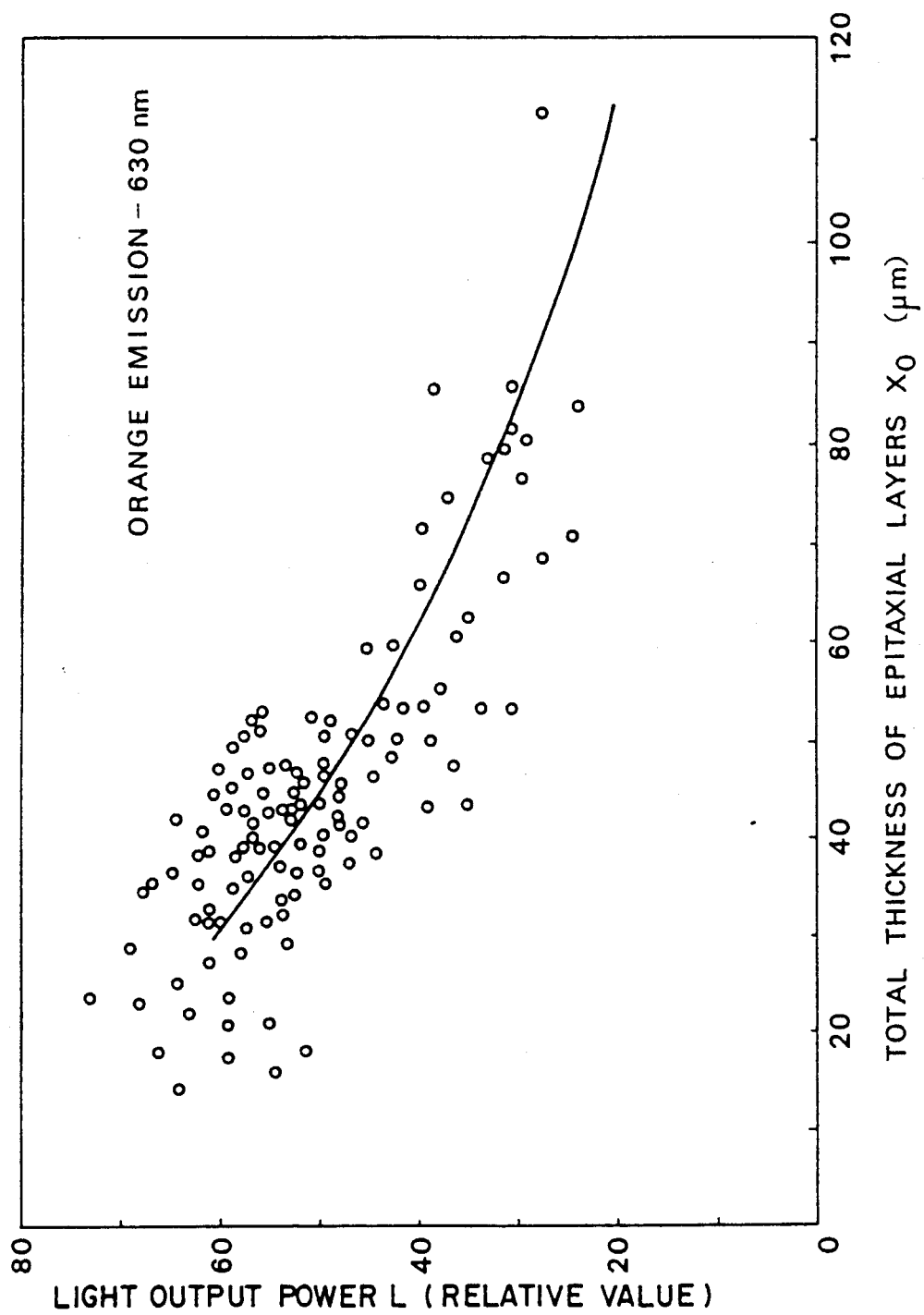
FIG. 3 shows a relationship between the total thickness of the epitaxial layers of a light-emitting diode for orange emission and the light output power (in relative values).

Next, in FIG. 3, sets of the data from the experiments mentioned above are shown in X-Y coordinates with respect to the total thickness of the epitaxial layers $x_0$ and light output power L and further, the equation of approximation obtained above is drawn in a solid line among the plotting of the data for comparison. The light-emitting diode used for the same experiments are of orange emission, and therefore the constant composition epitaxial layer 6 is composed of a mixed crystal $GaAs_{0.35}P_{0.65}$.

FIG. 4 shows another set of the data from the same experiments as those for FIG. 3. And in the figure, another equation of approximation is shown with the data above plotted. The light-emitting diode used in the case of FIG. 4, that is, the constant epitaxial layer 6 is composed of $GaAs_{0.15}P_{0.85}$ and the same diode emits yellow light.

FIGS. 3 and 4 show that the less the total thickness of the epitaxial layers, the higher the light output power L (relative values) becomes. The light output power L (relative values) obtained from the approximation is practically consistent with the experimental results as shown in FIGS. 3 and 4. This also confirms that the above approximate equations hold.

The total thickness of 40 $\mu$m of the epitaxial layers allows the light output power to be maximum. If the total epitaxial layer thickness is decreased toward less than 40 $\mu$m, the light output power becomes lower than the light output power presumed from the approximate equations stated above. Instead, the light output power shows a downward trend for the thickness less than 40 $\mu$m. But at as lower as 20 $\mu$m, the light output still observed is roughly the same level as that at around 40 $\mu$m. Consequently, FIGS. 3 and 4 show that the thickness of the epitaxial layers is preferably chosen to be 20 to 40 $\mu$m.

From the above conclusion, though it was reached in case the constant composition layer is 15 $\mu$m in thickness, in consideration of uncontrollable variations expected in experimental results, however, we can conclude that the total thickness of the epitaxial layers should be set at 20 to 40 $\mu$m with the thickness of the constant composition layers ranging form 10 to 20 $\mu$m. Here a 20 $\mu$m thickness of the constant composition layers corresponds to a 40 $\mu$m thickness of the total epitaxial layers. Further, the application of the above mentioned equations of approximation enables the thickness of the other epitaxial layers to be estimated through some experiments carried out in consideration of the established relationship between the thickness of epitaxial layers and the light output power at the time of the preparation of compound semiconductor wafers for light-emitting diodes.

As a result, a maximum allowable value of a particular or whole epitaxial layer thickness can be obtained relative to a determined light output power. It is possible that the allowable value of thickness thus obtained is utilized as an effective guide for light-emitting diode manufacture, within which a graded composition epitaxial layer shall be successfully prepared to improve the crystallinity of the constant epitaxial layers to the utmost extent.

Further, according to the preferred embodiments of the present invention the less total thickness of the epitaxial layers $x_0$ enables the throughput in the production line to be improved in accordance with the extent of the curtailed thickness. Incidentally, the relationship between the total epitaxial layer thickness $x_0$, the period of time required for the formation of epitaxial layers, and the light output power L (relative values) is shown in Table 2, In the table, letter n denotes the number of wafers and letter o denotes the variations in the thickness and the light output power.

TABLE 2

| | Total Thickness of Epitaxial Layers $x_0$ | | | Light Output Power L (Relative Values) | | |
|---|---|---|---|---|---|---|
| | Mean Thickness | | | | | |
| | m | $\sigma_{n-1}$ | n | Mean Output | $\sigma_{n-1}$ | n |
| Growth Time 300 min | 51.7 | 8.70 | 22 | 43.9 | 6.51 | 22 |
| Growth Time 280 min | 40.4 | 6.52 | 41 | 52.7 | 5.28 | 28 |

An explanation has been made about the present invention in conformity with the preferred embodiments. The present invention is not limited to the preferred embodiments stated above. Various modifications can be made, as a matter of course, without departing from the spirit of the present invention.

For example, GaP is used for a substrate according to the preferred embodiments of the present invention. This technique according to the preferred embodiments can also be applied to a GaAs substrate.

Further, an explanation has been made on light-emitting diodes prepared from $GaAs_{1-x}P_x$ as an example according to the preferred embodiments of the present invention stated above. This invention is not restricted to $GaAs_{1-x}P_x$, but also can be applied to other compound semiconductors in general.

Still further, the application of the preferred embodiments according to the present invention is not restricted to light-emitting diodes prepared by vapor phase growth to be employed mainly for compound semiconductor epitaxial growth, but also extended to liquid phase growth.

An explanation will be made on typical advantages to be obtained according to the present invention as follows:

It is possible that the actual conditions for preparing epitaxial wafers are efficiently determined in conformity with the purpose by applying the equation $L = exp(Ax_0 + B) + C$ to obtain a theoretical maximum thickness $x_0$ of total epitaxial layers for providing the required light output power and also by examining suitably the crystal growth conditions and the thickness of the constant composition epitaxial layers and graded alloy composition epitaxial layer for wafers to be used for preparation of compound semiconductor light-emitting diodes, which have epitaxial layers composed of $GaAs_{1-x}P_x$ ($0 \leq x \leq 1$), a light-emitting layer provided with a p-n junction being formed on the surface layer of the epitaxial layers. For example, in case of $GaAs_{1-x}P_x$ ($x = 0.85$), it is possible that the epitaxial layers 40 μm or less in thickness provide enough light output power.

What is claimed is:

1. A process for preparing a light-emitting diode characterized in that a required maximum thickness of compound semiconductor epitaxial layers is determined by presuming light output power from a total thickness of said epitaxial layers by way of following equation:

$$L = exp(Ax_0 + B) + C$$

where A, B and C are given values obtained from experiments and said light output power is L and the total thickness of said epitaxial layers is $x_0$, in preparing a compound semiconductor wafer for said light-emitting diode having said compound semiconductor epitaxial layers which are constituted by $GaAs_{1-x}P_x$ ($0 \leq x \leq 1$) formed on a compound semiconductor single-crystal substrate and having a light-emitting layer which is provided with a p-n junction formed in a surface layer region of said epitaxial layers.

* * * * *